United States Patent
Kobayashi et al.

[11] Patent Number: 5,881,455
[45] Date of Patent: Mar. 16, 1999

[54] METHOD OF FABRICATING THROUGH-HOLED WIRING BOARD

[75] Inventors: Masato Kobayashi; Yukio Yoshino, both of Nagaokakyo, Japan

[73] Assignee: Murata Manufacturing Co., Ltd., Japan

[21] Appl. No.: 724,028

[22] Filed: Sep. 23, 1996

Related U.S. Application Data

[63] Continuation of Ser. No. 246,351, May 19, 1994, abandoned.

[30] Foreign Application Priority Data

May 19, 1993 [JP] Japan ................................ 5-117222

[51] Int. Cl.⁶ ............................... H05K 3/42; B24C 1/04
[52] U.S. Cl. .................. 29/852; 29/90.7; 29/DIG. 36; 216/17; 216/65; 264/156; 264/162; 451/78
[58] Field of Search .................... 29/846, 852, 90.7, 29/DIG. 7, DIG. 36; 156/901, 632.1; 216/2, 17, 18, 19, 65; 427/304, 98; 430/281.1, 288.1; 264/154, 156, 162; 451/75, 76, 78

[56] References Cited

U.S. PATENT DOCUMENTS

| | | | |
|---|---|---|---|
| 3,570,195 | 3/1971 | Otsuka et al. ........................ 451/78 X |
| 4,044,222 | 8/1977 | Kestenbaum ........................ 437/173 X |
| 4,237,606 | 12/1980 | Niwa et al. ............................... 29/830 |
| 4,554,182 | 11/1985 | Bupp et al. ............................... 427/305 |
| 4,630,171 | 12/1986 | Dubuisson et al. ................. 29/25.42 X |
| 4,834,835 | 5/1989 | Cziep et al. ............................ 29/852 X |
| 4,865,877 | 9/1989 | Yamaguchi et al. ...................... 427/98 |
| 5,105,588 | 4/1992 | Verley et al. .......................... 451/78 X |
| 5,302,219 | 4/1994 | Hargis .................................. 264/61 X |
| 5,476,623 | 12/1995 | Ohtsubo .................................... 264/66 |
| 5,493,096 | 2/1996 | Koh .................................... 427/554 X |
| 5,517,758 | 5/1996 | Nakamura ..................... 29/DIG. 36 X |
| 5,532,105 | 7/1996 | Yamadera et al. .................. 430/288.1 |
| 5,593,528 | 1/1997 | Dings et al. .......................... 451/78 X |

FOREIGN PATENT DOCUMENTS

| | | | |
|---|---|---|---|
| 283863 | 11/1988 | Japan ..................................... 451/78 |
| 0164095 | 6/1989 | Japan ...................................... 29/852 |
| 4214696 | 8/1992 | Japan ............................. 29/DIG. 36 |
| 4057069 | 1/1993 | Japan ............................... 29/DIG. 7 |
| 790381 | 12/1980 | U.S.S.R. .................................. 451/78 |

*Primary Examiner*—Peter Vo
*Attorney, Agent, or Firm*—Ostrolenk, Faber, Gerb & Soffen, LLP

[57] ABSTRACT

A method of fabricating a through-holed wiring board comprising a step of forming a through hole in a ceramic wiring board with a laser beam, and a step of removing an alteration layer, defined on an inner wall portion of the through hole by solidification after thermal melting, by sandblasting.

14 Claims, 4 Drawing Sheets

METHOD OF FABRICATING THROUGH-HOLED WIRING BOARD

This is a continuation of application Ser. No. 08/246,351 filed on May 19, 1994, now abandoned.

BACKGROUND OF THE INVENTION

1. Field of the Invention

The present invention relates to a method of fabricating a through-holed wiring board by forming a through hole with a laser beam.

2. Description of the Background Art

In general, a through-holed wiring board is employed for packaging a hybrid IC or the like with high density. In relation to formation of a through hole in a ceramic substrate of alumina or the like, the following two methods are known in the art:

According to the first method, a through hole is formed in a green sheet, which in turn is fired. According to the second method, a through hole is formed in a fired substrate with a laser beam. In the first method, the cost is increased due to the requirement of a metal mold, and this method is unsuitable for fine wiring due to inferior positional accuracy of the through hole caused by contraction in firing. The second method utilizing a laser beam has no such problems, and is most widely employed at present.

In the second method, however, the through hole is formed by thermal energy of the laser beam, and hence the ceramic material is partially melted and thereafter cooled and therefore inevitably remains in the through hole in a vitreously solidified state which is specific to the ceramic material. Thus, an alteration layer which is solidified after thermal melting is defined in an inner wall portion of the through hole, with a number of cracks caused by thermal stress. When a metallized thick or thin film is formed on this alteration layer, therefore, this film is easily separated.

SUMMARY OF THE INVENTION

An object of the present invention is to provide a method of fabricating a through-holed wiring board, which can solve the problem of separation of a metal film formed on an inner wall portion of a through hole which is formed by a laser beam.

The method according to the present invention comprises a step of forming a through hole in a ceramic wiring board with a laser bean, and a step of removing an alteration layer, which is defined on an inner wall portion of the through hole by solidification after thermal melting, by sandblasting.

According to an aspect of the present invention, the method further comprises a step of forming a metal film on the inner wall portion of the through hole after sandblasting. According to the present invention, the metal film also includes an alloy film.

According to the present invention, the alteration layer defined on the inner wall portion of the through hole is removed by sandblasting, whereby the metal film formed on the inner wall portion of the through hole strongly adheres to the surface of the through hole, not to be easily separated therefrom. Thus, it is possible to fabricate a through-holed wiring board having high reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE

A though hole of about 0.6 mm in diameter was formed with a $CO_2$ laser beam in a prescribed position in of a through-holed wiring board of alumina of 99.5% in purity, having a thickness of 0.635 mm. The ceramic wiring board provided with the through hole was sandblasted.

Figure 1:
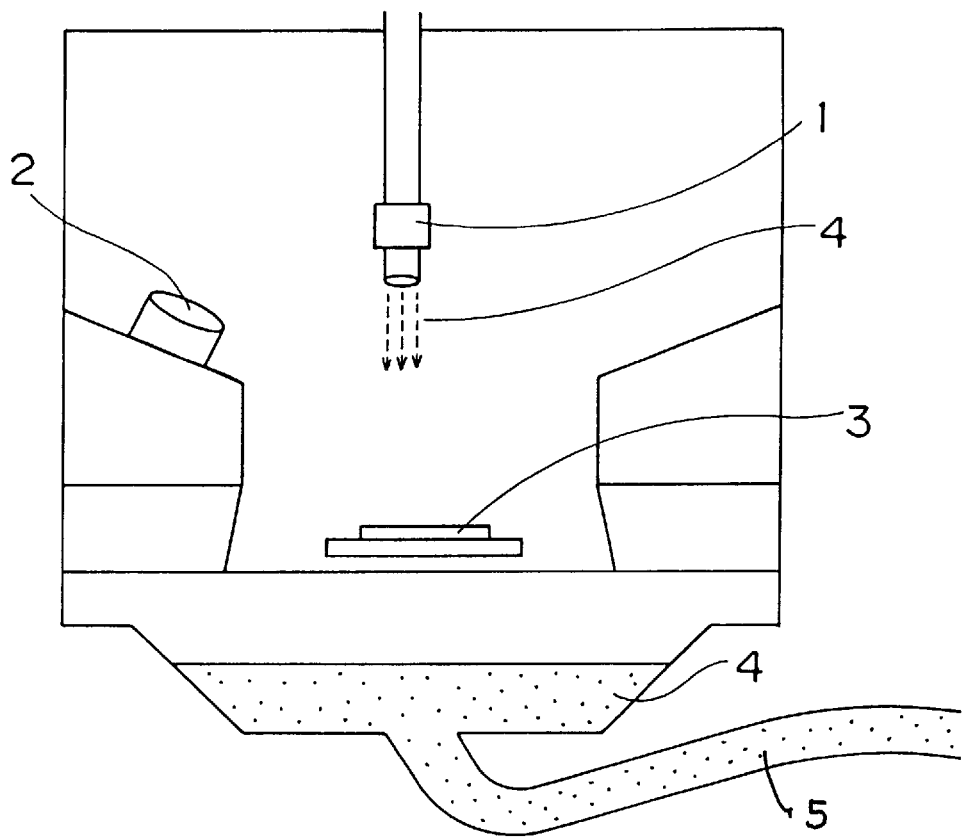
FIG. 1 is a schematic diagram showing a sandblaster employed in an Example of the present invention.

FIG. 1 is a schematic diagram showing a sandblaster employed for such sandblasting. This sandblaster is similar to a generally employed one. Referring to FIG. 1, a spray nozzle 1 is provided in an upper portion of the sandblaster, while a substrate 3 is set under the spray nozzle 1. Further, a pressure regulating tube 2 for pressure release is provided in the sandblaster. Sand 4 is sprayed from the spray nozzle 1 and dashed against the substrate 3, thereby sandblasting the same. Thereafter the sand 4 is collected in a collector tube 5.

In the aforementioned Example, the sand was prepared from SiC (silicon carbide) of #400 in grain size. This sand was sprayed from the spray nozzle 1 under a spraying pressure of 5 $KGf/cm^2$, to sandblast the wiring board for 2 minutes.

After the sandblasting, the surface of the ceramic wiring board, which was damaged by the sandblasting, was polished. In order to prevent such damage, a masking film may be formed on the ceramic wiring board by photosensitive resin or the like, so that sandblasting can be thereafter carried out and the masking film is removed after the sandblasting.

Figure 3:
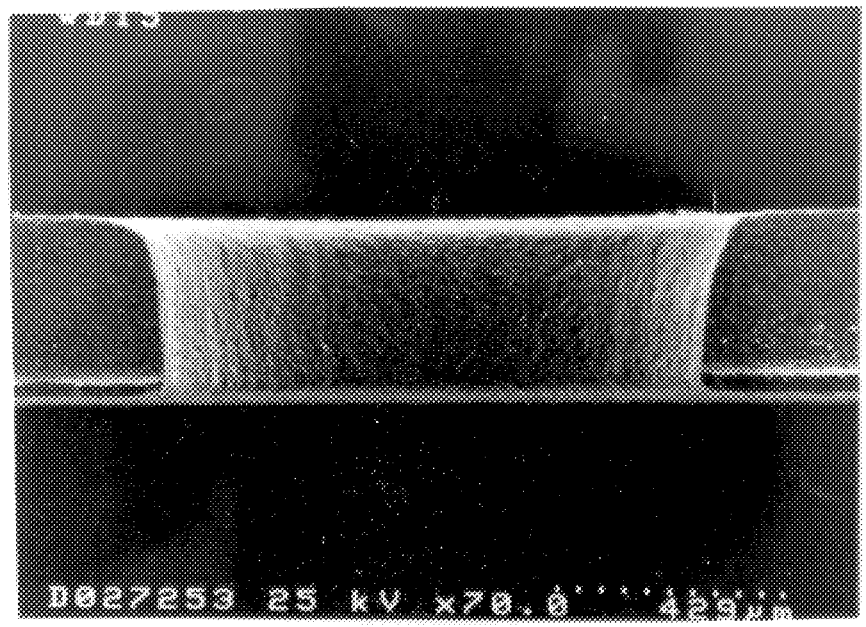
FIG. 3 is a scanning electron microphotograph showing a through hole sandblasted in the Example of the present invention.
Figure 4:
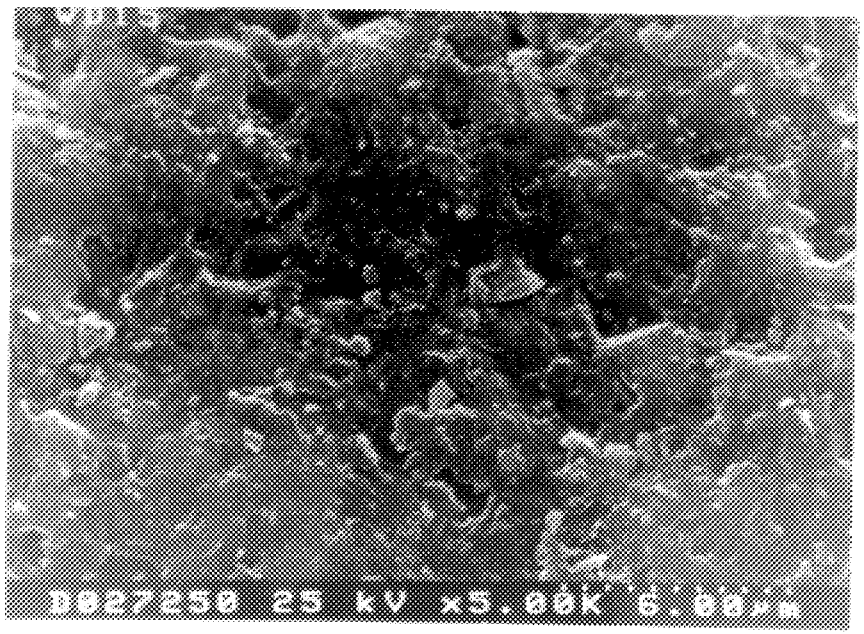
FIG. 4 is a scanning electron microphotograph showing an inner wall portion of the through hole shown in FIG. 3.
Figure 5:
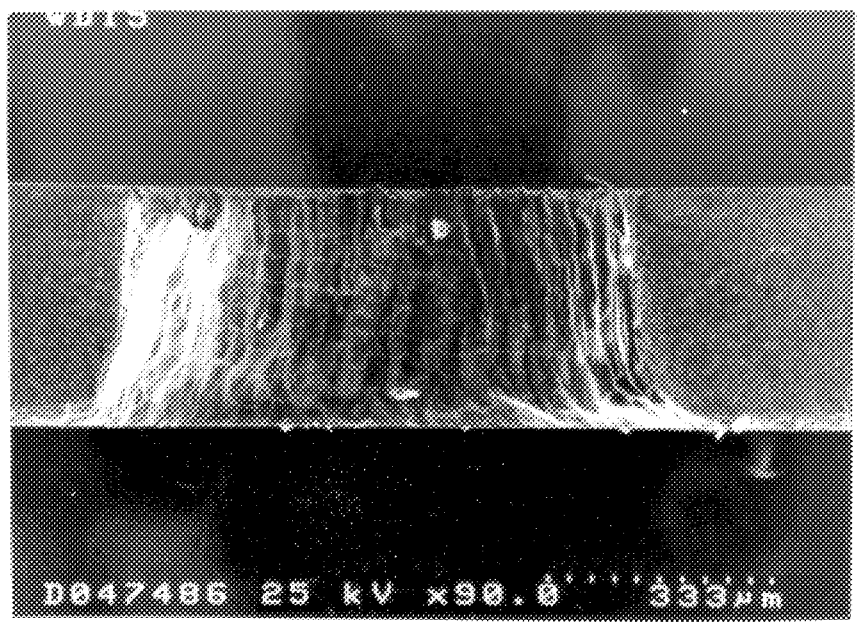
FIG. 5 is a scanning electron microphotograph showing a through hole formed by a conventional method.
Figure 6:
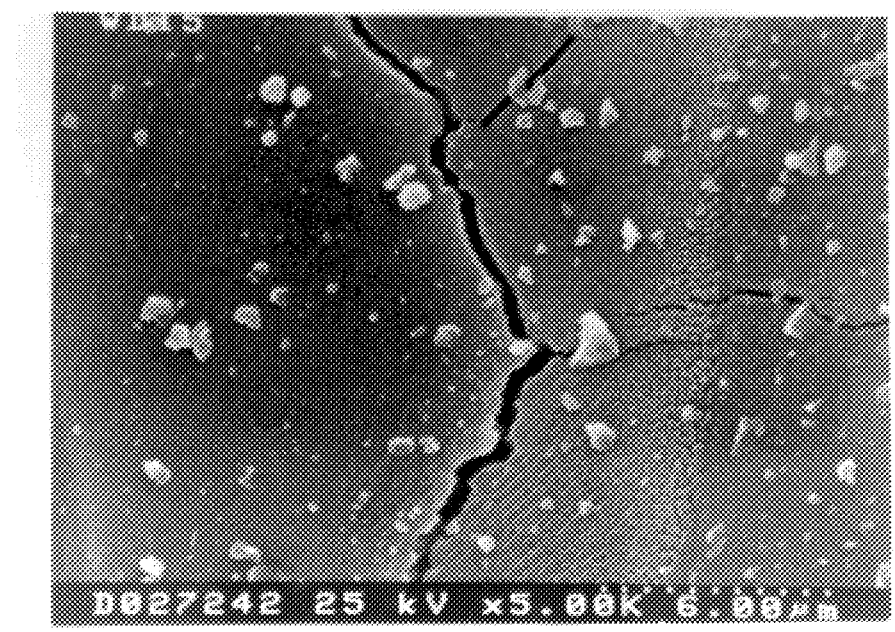
FIG. 6 is a scanning electron microphotograph showing an inner wall portion of the through hole shown in FIG. 5.

FIGS. 3 and 4 are scanning electron microphotographs showing an inner wall portion of the sandblasted through hole. FIGS. 5 and 6 are scanning electron microphotographs showing an inner wall portion of an untreated through hole. As clearly understood from FIGS. 5 and 6, a number of cracks are present in the inner wall portion of the through hole which is formed by irradiation with a laser beam. However, such cracks are removed by sandblasting according to the present invention as shown in FIGS. 3 and 4, and the inner wall portion of the through hole is provided with a fine texture surface. It is presumed that adhesion of a metal film which is formed on the inner wall portion of the through hole is improved by such a fine texture surface.

Figure 2:
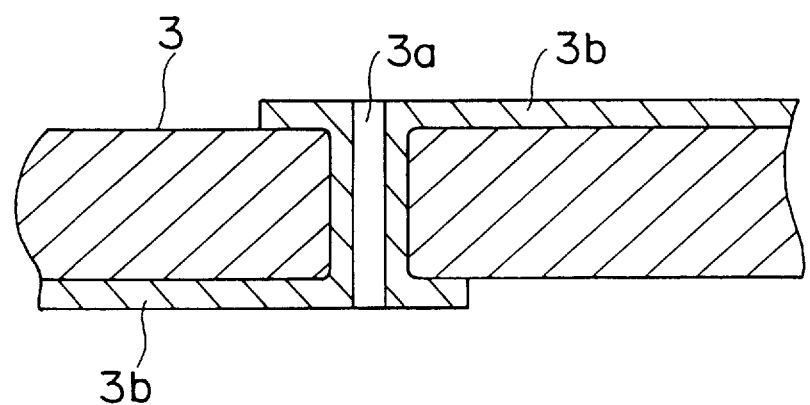
FIG. 2 is a sectional view showing a through hole portion of a through-holed wiring board fabricated in the Example of the present invention.

After the sandblasting, through hole conductors were formed. FIG. 2 shows a state after formation of such through hole conductors. Referring to FIG. 2, through hole conductors 3b are formed in a through hole 3a which is formed in a ceramic wiring board 3, and are also on the ceramic wiring board 3. Each through hole conductor 3b is formed by stacking an NiCr evaporation film of 400 Å in thickness, an Au evaporation film of 2000 Å in thickness and an Au plating film of 5 µm in thickness successively from below. The evaporation films provided in the through hole 1a are deposited with a planetary jig. The Au evaporation film is formed as an electrode for electrolytic plating for forming the Au plating film.

After the through hole conductors were formed in the aforementioned manner, 10 wiring boards provided with such conductors were inserted in an oven having a temperature of 450° C. under the atmosphere, and heated for 5 minutes. The samples were taken out after the heating, and subjected to investigation of the presence/absence of blistering and film separation in the through hole portions. For the purpose of comparison, 10 samples of through-holed wiring boards were additionally fabricated in a similar manner to the above except that no sandblasting was carried out, and also subjected to evaluation of blistering and film separation.

In the comparative samples of the through-holed wiring boards which were subjected to no sandblasting, blistering was confirmed in six samples while film separation was confirmed in two samples. In the inventive samples of the sandblasted through-holed wiring boards, on the other hand, neither blistering nor film separation was confirmed.

Thus, it is conceivable that the metal film provided in the through hole strongly adheres to the inner wall of the through hole due to the sandblasting.

According to the present invention, the through hole provided in the wiring board is not particularly restricted in size but the present invention is also applicable to a through hole of not more than 0.1 mm in diameter, for example. In this case, the sandblasting can be carried out by employing sand of a relatively small grain size.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a through-holed wiring board, comprising the steps of:

forming a through hole in a ceramic wiring board with a laser beam and thereby forming an alteration layer on an inner wall portion of said through hole by solidification after thermal melting of a portion of the material of the ceramic wiring board caused by said laser beam;

removing said alteration layer by sandblasting;

wherein said alteration layer contains at least one crack formed therein by laser irradiation, and wherein said sandblasting step removes said crack and gives said inner wall portion of said through hole a finer texture; and forming a metal film on said inner wall portion of said through hole after said sandblasting.

2. A method in accordance with claim 1, wherein said ceramic wiring board is made of alumina.

3. A method in accordance with claim 1, wherein said sandblasting is carried out with sand of silicon carbide.

4. A method in accordance with claim 1, wherein said metal film includes a NiCr film formed on said inner wall portion by evaporation.

5. A method in accordance with claim 4, wherein said ceramic wiring board is made of alumina.

6. A method in accordance with claim 1, further comprising the step of polishing said ceramic wiring board after said sandblasting step.

7. A method of fabricating a through-holed ceramic wiring board, comprising the steps of:

forming a through hole in a ceramic wiring board with a laser beam and thereby forming an alteration layer containing at least one crack on an inner wall portion of said through hole by solidification after thermal melting of a portion of the material of the ceramic wiring board caused by said laser beam;

removing said alteration layer containing said crack by sandblasting said board, thereby giving said inner wall portion of said through hole a finer texture; and forming a metal film on said inner wall portion of said through hole after said sandblasting;

wherein adhesion of said metal film to said inner wall portion of said through hole is improved by said finer texture of said through hole.

8. A method in accordance with claim 7, wherein said ceramic wiring board is made of alumina.

9. A method in accordance with claim 7, wherein said metal film includes a NiCr film formed on said inner wall portion by evaporation.

10. A method in accordance with claim 9, wherein said ceramic wiring board is made of alumina.

11. A method in accordance with claim 7, further comprising the step of polishing said ceramic wiring board after said sandblasting step.

12. A method of fabricating a through-holed alumina wiring board, comprising the steps of:

forming a through hole in an alumina wiring board with a laser beam and thereby forming an alteration layer containing at least one crack on an inner wall portion of said through hole by solidification after thermal melting of a portion of the material of the ceramic wiring board caused by said laser beam;

removing said alteration layer containing said crack by sandblasting said board, thereby giving said inner wall portion of said through hole a finer texture; and forming a metal film on said inner wall portion of said through hole after said sandblasting;

wherein adhesion of said metal film to said inner wall portion of said through hole is improved by said finer texture of said through hole.

13. A method in accordance with claim 12, wherein said metal film includes a NiCr film formed on said inner wall portion by evaporation.

14. A method in accordance with claim 12, further comprising the step of polishing said ceramic wiring board after said sandblasting step.

* * * * *